(12) United States Patent
Dorf et al.

(10) Patent No.: US 8,951,384 B2
(45) Date of Patent: Feb. 10, 2015

(54) ELECTRON BEAM PLASMA SOURCE WITH SEGMENTED BEAM DUMP FOR UNIFORM PLASMA GENERATION

(75) Inventors: Leonid Dorf, San Jose, CA (US);
Shahid Rauf, Pleasanton, CA (US);
Kenneth S. Collins, San Jose, CA (US);
Nipun Misra, San Jose, CA (US);
James D. Carducci, Sunnyvale, CA (US); Gary Leray, Mountain View, CA (US); Kartik Ramaswamy, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 242 days.

(21) Appl. No.: 13/595,292

(22) Filed: Aug. 27, 2012

(65) Prior Publication Data

US 2013/0098882 A1 Apr. 25, 2013

Related U.S. Application Data

(60) Provisional application No. 61/549,349, filed on Oct. 20, 2011.

(51) Int. Cl.
| | |
|---|---|
| *H05H 1/46* | (2006.01) |
| *G21K 5/00* | (2006.01) |
| *H01J 37/32* | (2006.01) |
| *H05H 7/00* | (2006.01) |

(52) U.S. Cl.
CPC ............ *H01J 37/3233* (2013.01); *H05H 1/46* (2013.01); *H05H 7/001* (2013.01); *G21K 5/00* (2013.01)
USPC .................................. 156/345.4; 315/111.81

(58) Field of Classification Search
CPC ................................. H05H 7/001; H05H 1/46
USPC ............... 156/345.1–345.55; 216/65, 67, 63; 315/111.81; 250/492.3
See application file for complete search history.

(56) References Cited

U.S. PATENT DOCUMENTS

| | | | |
|---|---|---|---|
| 3,755,073 A * | 8/1973 | Haught et al. | ............... 376/122 |
| 5,003,178 A | 3/1991 | Livesay | |
| 5,368,676 A | 11/1994 | Nagaseki et al. | |
| 5,539,274 A | 7/1996 | Araki et al. | |
| 5,874,807 A | 2/1999 | Neger et al. | |
| 5,903,106 A | 5/1999 | Young et al. | |
| 6,116,187 A | 9/2000 | Murakami et al. | |
| 6,291,940 B1 | 9/2001 | Scholte Van Mast | |
| 6,348,158 B1 | 2/2002 | Samukawa | |
| 6,356,026 B1 | 3/2002 | Murto | |

(Continued)

FOREIGN PATENT DOCUMENTS

| | | |
|---|---|---|
| JP | 08-222553 A | 8/1996 |
| JP | 2001-085414 A | 3/2001 |

(Continued)

OTHER PUBLICATIONS

U.S. Appl. No. 13/595,452, filed Aug. 27, 2012, Bera et al.

(Continued)

*Primary Examiner* — Samuel M Heinrich
(74) *Attorney, Agent, or Firm* — Robert M. Wallace

(57) ABSTRACT

A plasma reactor that generates plasma in a workpiece processing chamber by an electron beam, has an electron beam source and segmented beam dump that is profiled to promote uniformity in the electron beam-produced plasma.

16 Claims, 11 Drawing Sheets

(56) References Cited

U.S. PATENT DOCUMENTS

| | | |
|---|---|---|
| 6,407,399 B1 | 6/2002 | Livesay |
| 6,452,338 B1 * | 9/2002 | Horsky .................... 315/111.81 |
| 6,501,081 B1 | 12/2002 | Foad et al. |
| 7,470,329 B2 * | 12/2008 | Oehrlein et al. .............. 118/720 |
| 7,547,899 B2 * | 6/2009 | Vanderpot et al. ....... 250/492.21 |
| 7,734,014 B2 | 6/2010 | Bergmann et al. |
| 2002/0004309 A1 | 1/2002 | Collins et al. |
| 2002/0078893 A1 | 6/2002 | Os et al. |
| 2002/0168049 A1 | 11/2002 | Schriever et al. |
| 2004/0104353 A1 | 6/2004 | Berglund |
| 2007/0040130 A1 | 2/2007 | Nanataki et al. |
| 2007/0170414 A1 | 7/2007 | Takai et al. |
| 2007/0278417 A1 | 12/2007 | Horsky et al. |
| 2009/0140176 A1 | 6/2009 | Hershkowitz et al. |
| 2009/0159811 A1 | 6/2009 | Klemm et al. |
| 2010/0032587 A1 | 2/2010 | Hosch et al. |
| 2011/0024047 A1 | 2/2011 | Nguyen et al. |
| 2012/0258601 A1 | 10/2012 | Holland et al. |
| 2012/0258606 A1 | 10/2012 | Holland et al. |
| 2012/0258607 A1 | 10/2012 | Holland et al. |
| 2014/0035458 A1 | 2/2014 | Wu et al. |

FOREIGN PATENT DOCUMENTS

| | | |
|---|---|---|
| KR | 10-2005-0008065 A | 1/2005 |
| KR | 10-2007-0041220 A | 4/2007 |
| KR | 10-2009-0008932 A | 1/2009 |
| KR | 10-2010-0042610 A | 4/2010 |

OTHER PUBLICATIONS

U.S. Appl. No. 13/595,134, filed Aug. 27, 2012, Dorf et al.
U.S. Appl. No. 13/595,201, filed Aug. 27, 2012, Dorf et al.
U.S. Appl. No. 13/595,252, filed Aug. 27, 2012, Dorf et al.
U.S. Appl. No. 13/595,351, filed Aug. 27, 2012, Bera et al.
U.S. Appl. No. 13/595,655, filed Aug. 27, 2012, Ramaswamy et al.
U.S. Appl. No. 13/595,612, filed Aug. 27, 2012, Bera et al.
Furman, M.A., et al. "Stimulation of Secondary Electron Emission Based Upon a Phenomenological . . . " LBNL-52807/SLAC-PUB-9912, Jun. 2, 2003, pp. 1-31, Lawrence Berkely Natl. Lab.
U.S. Appl. No. 14/175,365, filed Feb. 10, 2014, Dorf et al.
Official Action Issued Aug. 6, 2014 in Related U.S. Appl. No. 13/595,452.
Official Action Issued Sep. 27, 2014 in Related U.S. Appl. No. 13/595,612.
Official Action Dated Nov. 25, 2014 Issued in Related U.S. Appl. No. 13/595,612.

* cited by examiner

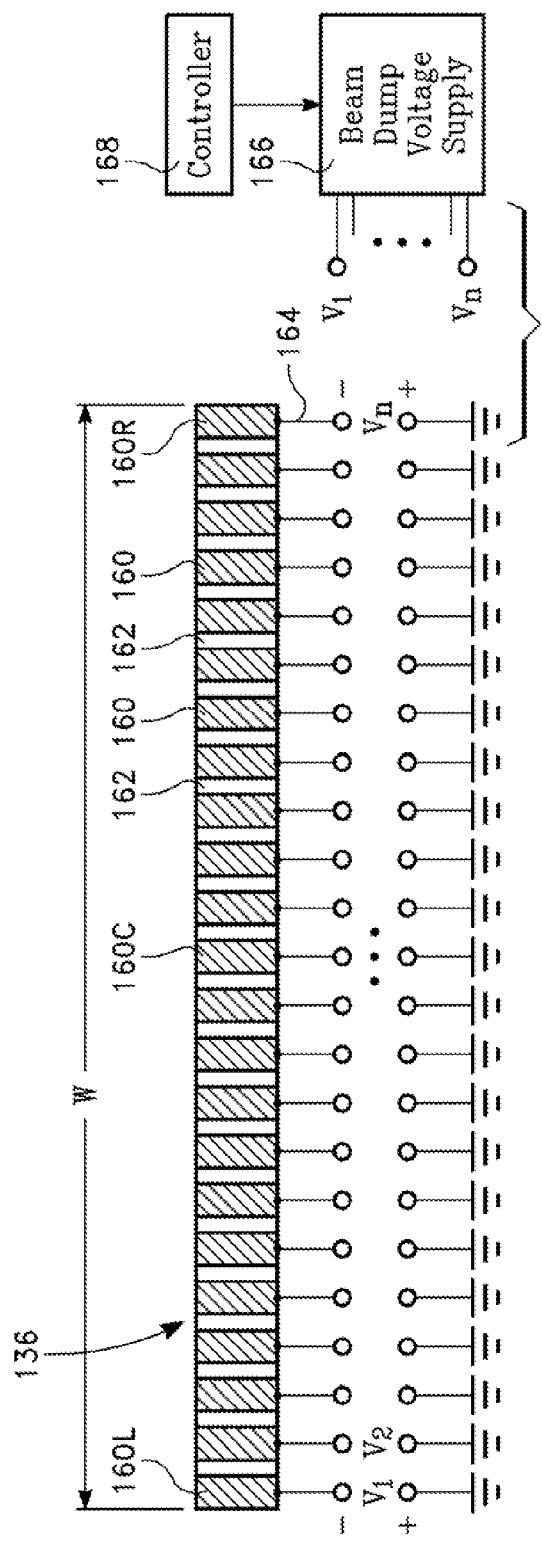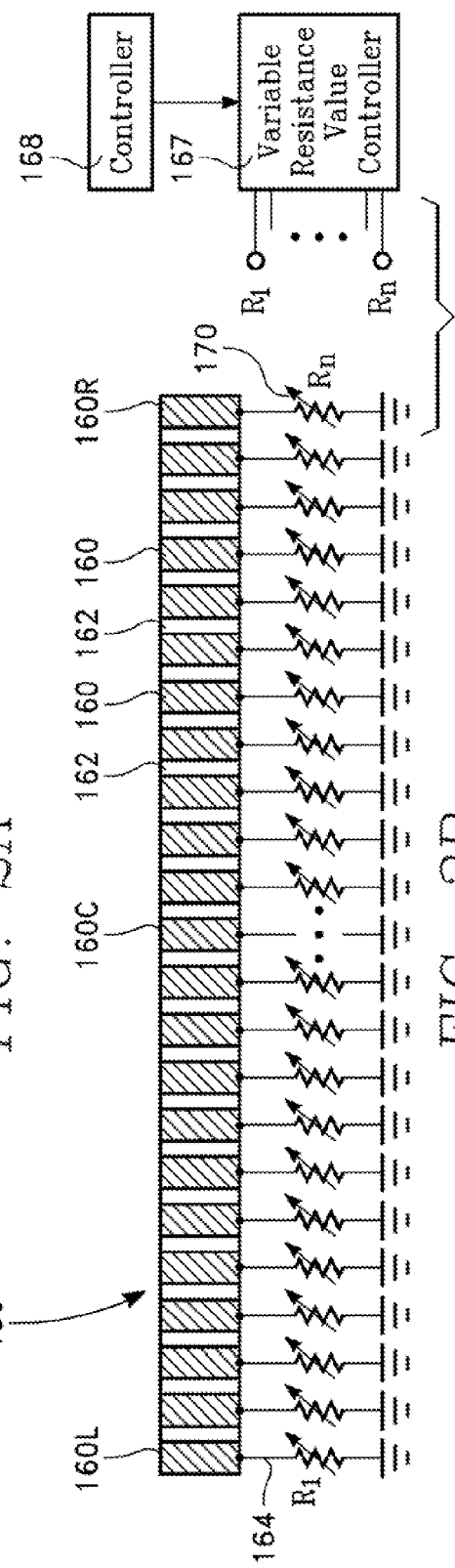

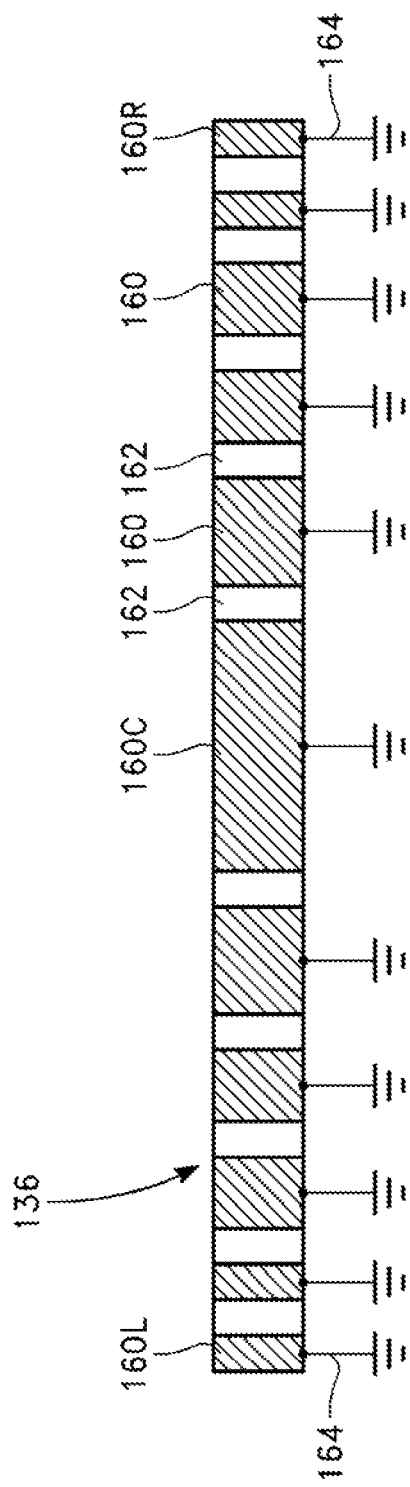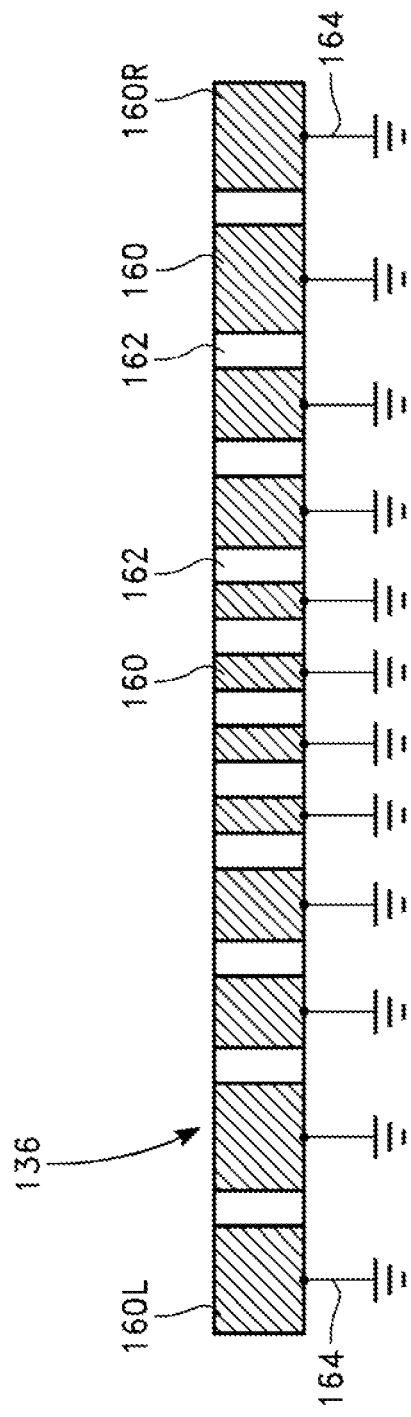

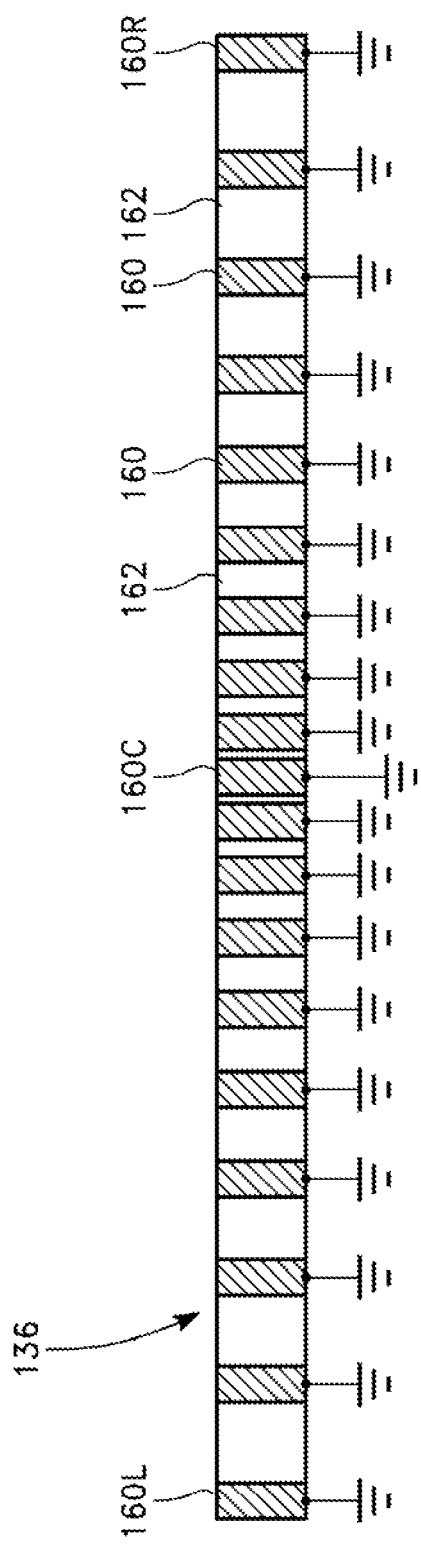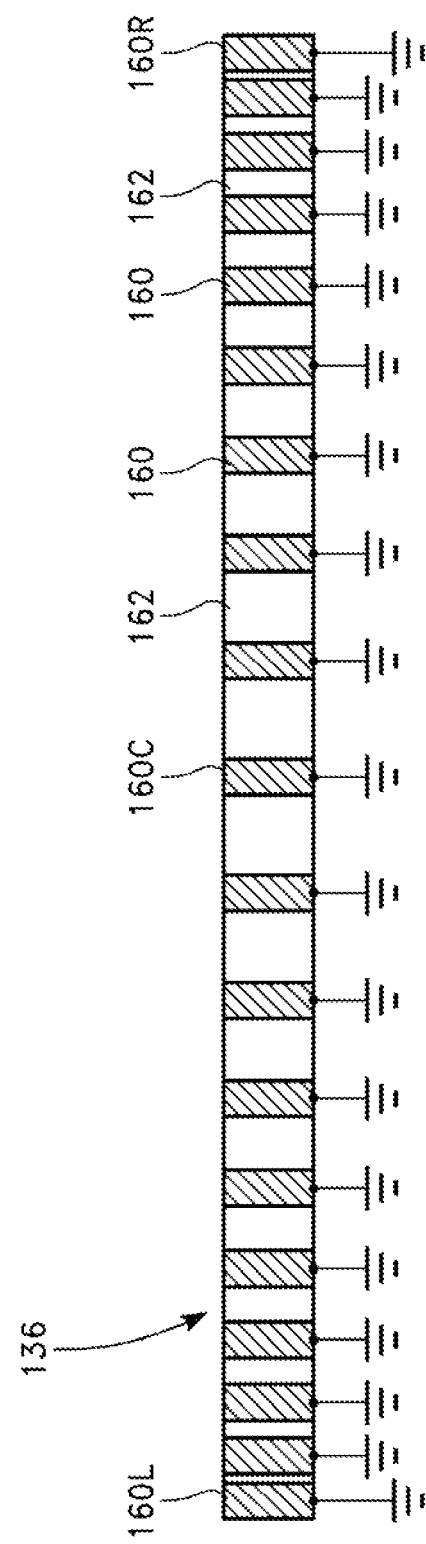

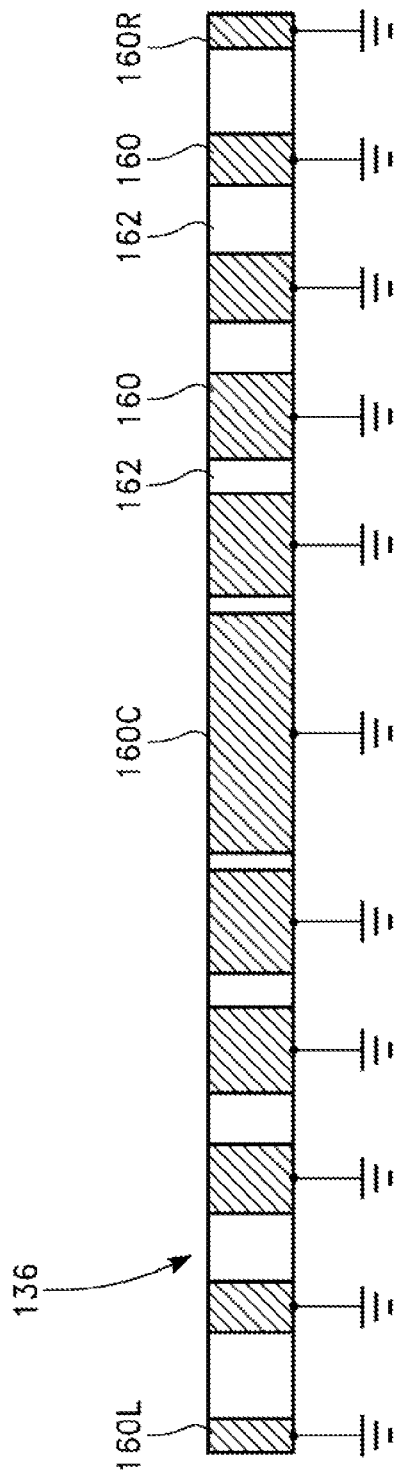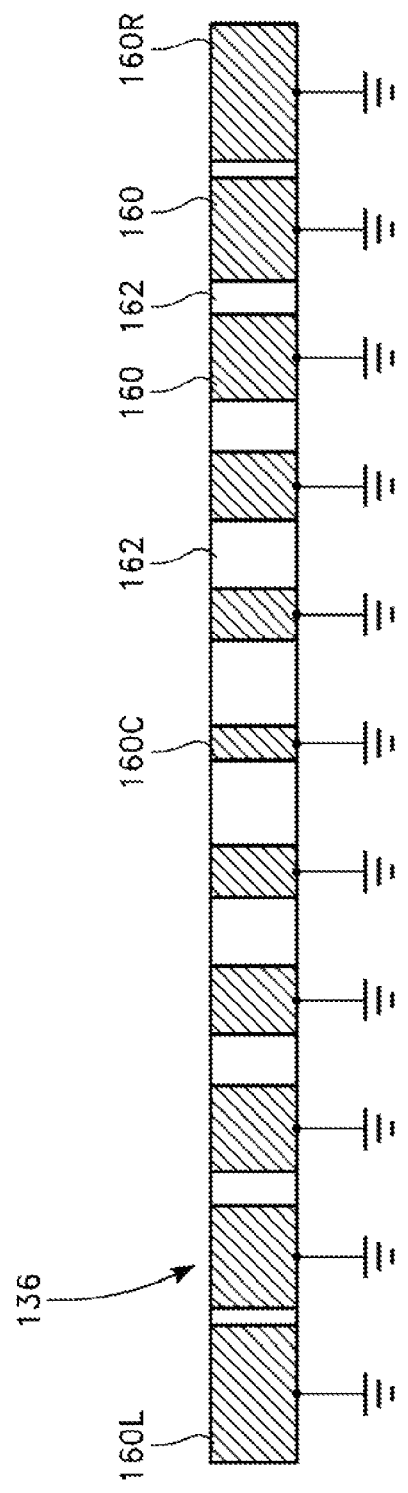

ELECTRON BEAM PLASMA SOURCE WITH SEGMENTED BEAM DUMP FOR UNIFORM PLASMA GENERATION

CROSS-REFERENCE TO RELATED APPLICATIONS

This application claims the benefit of U.S. Provisional Application Ser. No. 61/549,349, filed Oct. 20, 2011 entitled ELECTRON BEAM PLASMA SOURCE WITH SEGMENTED BEAM DUMP FOR UNIFORM PLASMA GENERATION, by Leonid Dorf, et al.

BACKGROUND

A plasma reactor for processing a workplace can employ an electron beam as a plasma source. Such a plasma reactor can exhibit non-uniform distribution of processing results (e.g., distribution of etch rate across the surface of a workplace) due to non-uniform distribution of electron density and/or kinetic energy within the electron beam. Such non-uniformities can be distributed in a direction transverse to the beam propagation direction.

SUMMARY

A plasma reactor for processing a workplace includes a workplace processing chamber having a processing chamber enclosure including a ceiling and a side wall and an electron beam opening in the side wall. A workpiece support pedestal in the processing chamber has a workplace support surface facing the ceiling and defining a workplace processing region between the workplace support surface and the ceiling. The electron beam opening faces the workplace processing region. There is further provided an electron beam source chamber including an enclosure that is open to the workpiece processing chamber, and a beam dump in the chamber on a side of the chamber opposite to the electron beam opening. The electron beam opening and the beam dump define an electron beam path there-between along the first axis. The beam dump includes an array of metal collectors insulated from one another and distributed along the second axis transverse to the first axis. The array of metal collectors is profiled structurally or electrically to have a desired effect on the plasma density profile along the second axis.

In one electrically profiled embodiment, the beam dump further includes a source of individually controlled negative voltages connected to individual ones of the array of metal collectors, and a controller for setting the individually controlled voltages in accordance with the desired profile. In another electrically profiled embodiment, the beam dump further includes a set of individually controlled variable resistors connected between individual ones of the array of metal collectors and a ground, and a controller for setting resistances of the individually controlled variable resistors in accordance with the desired profile.

In structurally profiled embodiments, the segmented beam damp has a distribution of density of the metal collectors along the second axis, in accordance with the desired profile. In one structurally profiled embodiment, the array of metal collectors includes collectors of different areas positioned along the second axis, in accordance with the desired profile. In another structurally profiled embodiment, the array of metal collectors are spaced apart from one another by respective spaces, wherein the respective spaces are of different sizes and are positioned along the second axis, in accordance with the desired profile. In one version of this embodiment, the metal collectors may be of a uniform size or area. In another version, the array of metal collectors includes collectors of different sizes. In a yet further embodiment, both the sizes of the metal collectors and the spacing between them are non-uniformly distributed along the second axis in accordance with the desired profile. In a further embodiment, the beam dump is segmented into regions having different secondary electron emission coefficients, profiled along the second axis.

BRIEF DESCRIPTION OF THE DRAWINGS

So that the manner in which the exemplary embodiments of the present invention are attained can be understood in detail, a more particular description of the invention summarized above is given by reference to the embodiments thereof which are illustrated in the appended drawings, it is to be appreciated that certain well known processes are not discussed herein in order to not obscure the invention.

FIG. 2A is a front view of a beam dump that is electrically profiled, in accordance with a first embodiment.

FIG. 2B is a front view of a beam dump that is electrically profiled, in accordance with a second embodiment.

FIG. 2C is a front view of a beam dump that is structurally profiled in accordance with a first embodiment.

FIG. 2D is a front view of a beam dump that is structurally profiled, in accordance with a second embodiment.

FIGS. 2E and 2F depict structurally profiled beam dumps employing uniformly sized metal collectors with varying collector-to-collector spacing.

FIG. 2G and 2H depict structurally profiled beam dumps employing differently sized metal collectors with varying collector-to-collector spacing.

Figure 1A:
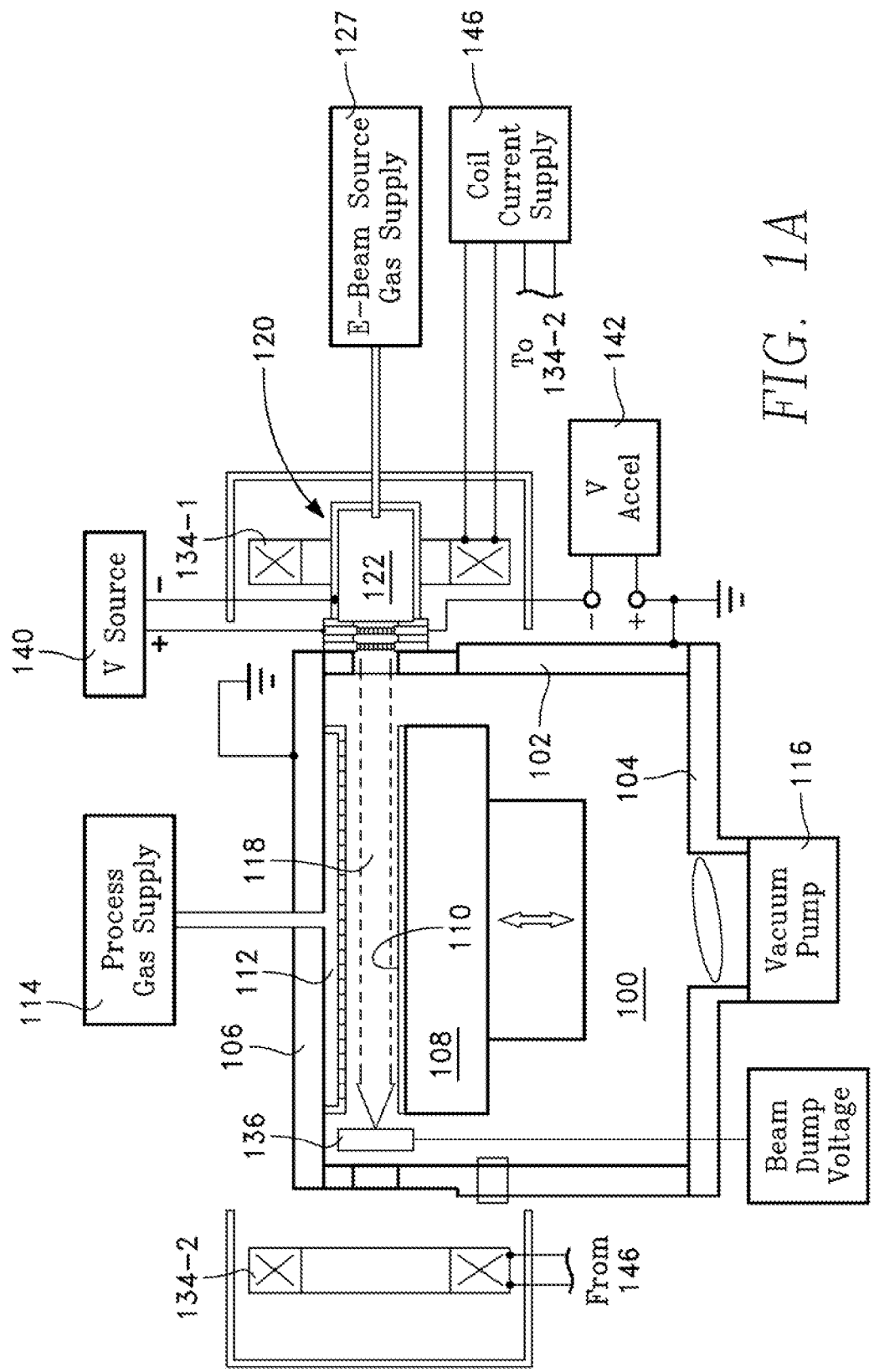
FIG. 1A is a side view of a plasma reactor having an electron beam as a plasma source, and having a beam dump that is profiled electrically or structurally.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments,

DETAILED DESCRIPTION

Introduction:

In a processing chamber with grounded conductive wails, the plasma produced by an electron beam resides at the plasma potential, $V_{p0}$, only a few volts above ground potential. This is due to a very low electron temperature, $T_e \sim 0.5\text{-}1$ eV, and the resultant small voltage drop in the sheath at the chamber walls. This sheath repels some electrons to balance electron and ion plasma currents and maintain charge neutrality in the chamber. Therefore, if the (metal) beam dump is connected to ground, high-energy beam electrons, $E_b \sim 2$ keV, injected from the source are not repelled, by the low-voltage sheath at the beam dump surface and are all collected there; thus maintaining constant fast-electron density in the chamber in the steady-state. However, if a segment of the beam dump is kept at a negative potential to ground, the voltage in the sheath is determined by this potential and may be sufficient to repel some of the beam electrons. The fraction of the repelled high-energy beam electrons is an increasing function of the absolute value of the potential (above a threshold value determined by the kinetic energy of the beam electrons). The repelled fast electrons can then bounce back and forth between the negatively biased grid, in the electron beam source and the negatively biased beam dump segment, resulting in their entrapment, similarly to that in a "magnetic mirror" machine. In a steady state, this leads to an increase in the fast electron density, and hence to an increase in plasma ionization and plasma density. The regions of the chamber with enhanced ionization lie on the magnetic field lines crossing the segments kept at negative potentials to ground. Splitting the beam dump into multiple segments with individually controlled potentials can thus allow control over plasma uniformity across the entire beam width, Placing small shunt resistors (with negligible voltage drops across them) in series and measuring currents through the segments can provide a feedback about the spatial distribution of fractions of repelled beam electrons. This information can be used to automate the process of controlling the potentials.

The electric potentials of the beam dump segments may be controlled directly, using dc bias power supplies, or indirectly, by connecting some segments to ground through resistors. The voltage drop across the resistor (which is a product of the current through the segment/resistor and the resistor value) determines the negative potential of the segment to ground, and hence the voltage drop in the sheath adjacent to the segment. The fraction of the repelled beam electrons (and hence enhancement in ionization) is an increasing function of the value of the external resistor (above a threshold value).

Note that diffusion across the magnetic field (which increases with the chamber neutral fill pressure) causes spreading of the repelled beam electrons over the entire beam width, thus smoothing the effect of electrical profiling. Diffusion also promotes collection of the trapped (bouncing) fast electrons by the grounded segments and chamber walls. This balances total injected, and collected currents of the fast electrons, maintaining a constant fast electron density in the chamber. Thus, in a steady state, the flow of beam electrons is steered towards the grounded surfaces, whereas the fast electron density (and so ionization) is increased in the regions that have segments kept at large negative potentials to ground.

Note also that keeping some beam dump segments at large negative potentials to ground creates an imbalance between plasma electron and ion currents to these segments, since nearly all of the low-energy plasma electrons are repelled by the sheath voltage drop. Thus, to maintain charge neutrality and the plasma electron density in the chamber (in steady-state), the plasma potential in the chamber can be expected to decrease below $V_{p0}$. As a result, the plasma electron current to the chamber walls and grounded beam dump segments increases and exceeds the ion current to these surfaces, such that the overall plasma current to all surfaces in the chamber is zero. It should be noted that this decrease in the plasma potential is expected to foe small, because the total area of the grounded surfaces is much greater than the area of the beam dump segments connected to ground through external, resistors or negatively biased using the power supplies.

Another method of controlling the transverse plasma uniformity is the "passive" segmented beam dump, where some of the segments are made of a dielectric material (i.e., they are dielectric inserts or spacers) to reproduce the situation with an infinitely large external resistor. The total current to such insulated (floating) surface is zero, so assuming that all low-energy plasma electrons are repelled by the sheath voltage drop, the beam electron current to the wall, $I_{bw}$, must equal the ion current, $I_{iw}$. From this we readily obtain the repelled fraction of the beam electrons $I_{bw}/I_n=(1-I_1/I_b)$. In this method, the spatial frequency with which the dielectric inserts are distributed in the beam dump controls the repelled electron fraction (and hence ionization and plasma density) profile across the beam width. Ionization is enhanced in the regions with large spatial density of the dielectric inserts (insulators). This fact may be used to compensate for non-uniformities in the distribution of the density and/or kinetic energy of beam electrons across the e-beam width.

It is clear that this "dielectric inserts" method is only effective when diffusion of the plasma across the magnetic field (which is parallel to the beam plane and is used to confine beam electrons) is significant; otherwise, the effect of the inserts may be reversed. This reverse effect is one in which ionization is not enhanced—it is relatively depressed—in the regions with large spatial density of the dielectric inserts. Indeed, when beam electrons initially enter the chamber before the plasma is formed, they charge up the surface of the dielectric, so that all electrons are repelled and the current to it is zero. The beam current is thus diverted towards the conductive segments, forming the corresponding plasma production pattern. Unless diffusion is significant, plasma will not spread and fill the volume in front of the dielectric segments to shield the diverting fields, and the reverse effect referred to above will occur.

The information presented in paragraphs [18]-[23] above does not take into account secondary electron emission (SEE) from the beam dump. Secondary electron emission may be caused by highly energetic primary beam electrons and depends strongly on the beam dump material. Let us now consider the case of strong secondary electron emission, in which the flux of secondary electrons emitted by the wall represents a large fraction (up to or greater than 1) of the flux of the incident (primary) high-energy beam electrons. Note that the beam dump still absorbs all of the kinetic energy of the beam electrons. Typically, three groups of secondary electrons are observed: (a) elastically scattered (ES) electrons with energies equal or close to the initial beam energy—their portion is expected to be a few to several percent, (b) true secondaries (TS) with energies of the order of 50 eV—their portion is the largest at 50-60%, and (c) rediffused (RD) electrons, with energies equally spread between ES and TS—their portion can be 30-40% [data is based on M. A. Furman and M. T. F. Pivi, *"Simulation Of Secondary Electron Emission Based On A Phenomenological Probabilistic Model"*, Report LBNL-52807/SLAC-PUB-9912, Jun. 2, 2003, Lawrence Berkeley National Laboratory]. The above data indicates that there is a significant portion of secondary electrons with sufficient energies to cause ionization comparable to that of the beam electrons. Thus, one can control the ionization profile across the e-beam width by composing the beam dump from segments made of materials with different secondary electron emission coefficients. Fast electron density and ionization are enhanced in the regions that have beam dump segments with large SEE coefficients. Examples of metals and alloys with different secondary electron emission coefficients (yields) include: Aluminum (M), Titanium (Ti), Copper (Cu), Iron (Fe), Stainless Steel (SS). Depositing a thin metal or alloy film (such as TiSr, TiZrV, Cu, AgTi) on the surface of another metal, or subjecting a bulk metallic object to a surface treatment (such as thermal baking) also strongly affects the secondary electron emission yield, in steady state, secondary electrons in front of the segments with high SEE coefficients diffuse across the magnetic field and are collected at the segments with small SEE coefficients and at the chamber walls, as described above in paragraph [20], thus balancing injected and collected currents of high-energy electrons and conserving their density in the chamber. Note that presence of SEE (or any other effects on e-beam current) is not expected to significantly change plasma potential (compared to $V_{p0}$) in front of the beam dump segments with high SEE or in the rest of the chamber, since the beam electron density is ~4 orders of magnitude smaller than the plasma, density. Therefore, if all beam dump segments are grounded, electron and ion plasma currents are balanced locally at all surfaces in the chamber.

The foregoing indicates that the distribution of the regions with enhanced ionization may be spatially in-or out-of-phase (or anywhere in between) with the distribution of the segments that repel beam electrons (or emit secondary electrons). The factors determining the outcome of using the segmented beam dump methods presented here include, but are not limited to: (a) the coefficient of diffusion across the magnetic field, (b) the relative portion of the segments that repel incident beam electrons, (c) the materials of the beam dump segments. An ordinary skilled worker can readily determine the effect of a given beam dump profile (electrical or structural) on plasma uniformity using the empirical methods, like wafer etch rate measurements, and thus make use of the segmented beam dump methods described herein to compensate for electron beam non-uniformities.

Figure 1B:
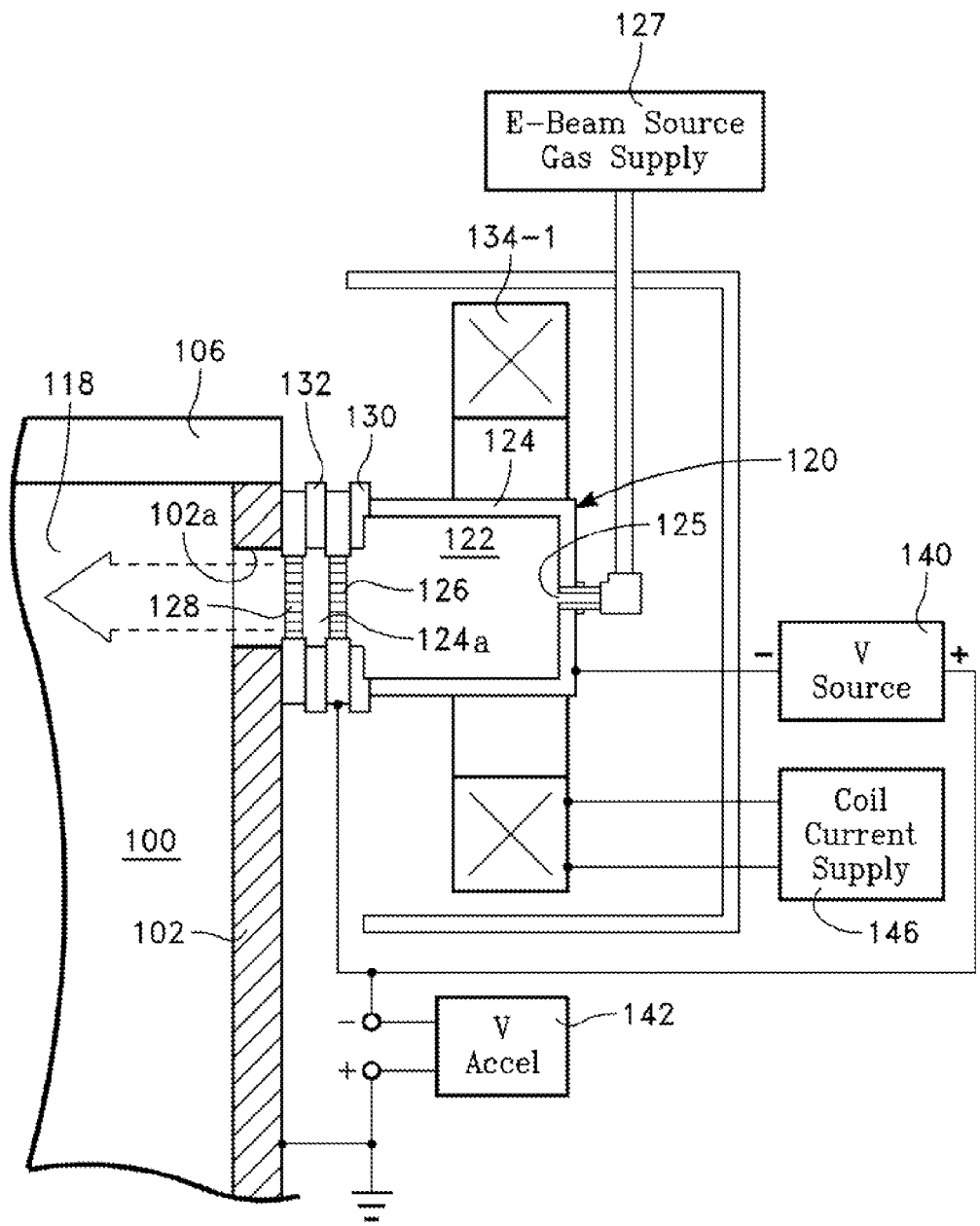
FIG. 1B is an enlarged view of a portion of FIG. 1A.
Figure 1C:
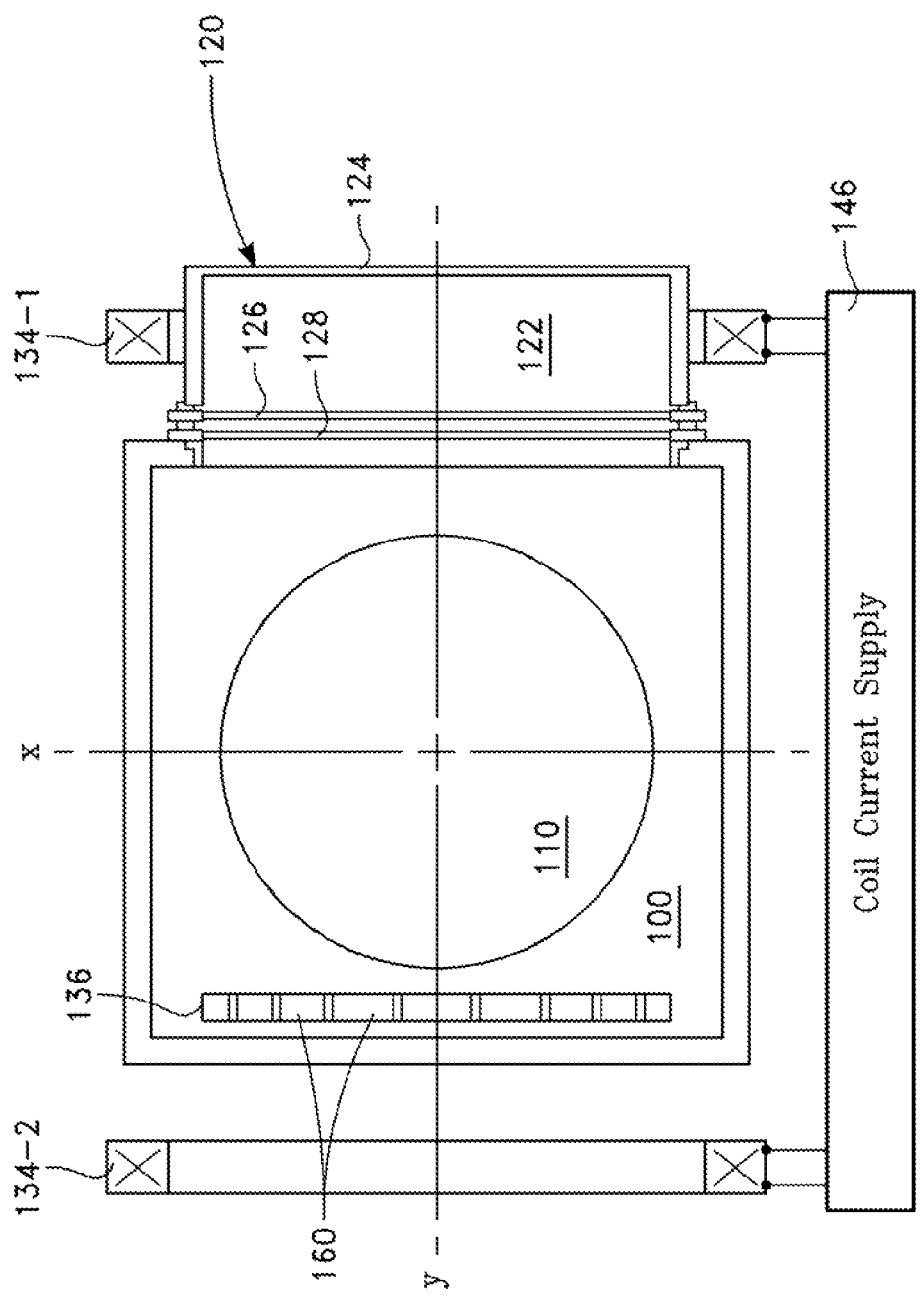
FIG. 1C is a top view of the plasma reactor of FIG. 1A.

Exemplary Embodiments:

Referring to FIGS. 1A-1C, a plasma reactor has an electron beam as a plasma source. The reactor includes a process chamber 100 enclosed by a cylindrical side wall 102, a floor 104 and a ceiling 106. A workplace support pedestal 108 supports a workplace 110, such as a semiconductor wafer, the pedestal 108 being movable in the axial (e.g., vertical) direction. A gas distribution plate 112 is integrated with or mounted on the ceiling 106, and receives process gas from a process gas supply 114. A vacuum pump 116 evacuates the chamber through the floor 104. A process region 118 is defined between the workpiece 110 and the gas distribution plate 112. Within the process region 118, the process gas is ionized to produce a plasma for processing of the workpiece 110.

The plasma is generated in the process region 118 by an electron beam from an electron beam source 120. The electron beam source 120 includes a plasma generation chamber 122 outside of the process chamber 100 and having a conductive enclosure 124. The conductive enclosure 124 has a gas inlet or neck 125. An electron beam source gas supply 127 is coupled to the gas inlet 125. The conductive enclosure 124 has an opening 124a facing the process region 118 through an opening 102a in the sidewall 102 of the process chamber 100.

The electron beam source 120 includes an extraction grid 126 between the opening 124a and the plasma generation chamber 122, and an acceleration grid 123 between the extraction grid 126 and the process region 118, best seen in the enlarged view of FIG. 1B. The extraction grid 126 and the acceleration grid 123 may be formed as separate conductive meshes, for example. The extraction grid 126 and the acceleration grid 128 are mounted with insulators 130, 132, respectively, so as to be electrically insulated from one another and from the conductive enclosure 124. However, the acceleration grid 123 is in electrical contact with the side wall 102 of the chamber 100. The openings 124a and 102a and the extraction and acceleration grids 126, 128 are mutually congruent, generally, and define a thin wide flow path for an electron beam, into the processing region 118. The width of the flow path is about the diameter of the workplace 110 (e.g., 100-400 mm) while the height of the flow path is less than about two inches.

The electron beam source 120 further includes a pair of electromagnets 134-1 and 134-2 adjacent opposite sides of the chamber 100, the electromagnet 134-1 surrounding the electron beam source 120. The two electromagnets 134-1 and 134-2 produce a magnetic field parallel to the electron bears path. The electron beam flows across the processing region 118 over the workpiece 110, and is absorbed on the opposite side of the processing region 118 by a beam dump 136, The beam dump 136 is a conductive body having a shape adapted to capture the wide thin electron beam.

In order to improve plasma uniformity within the processing region 118 along an axis (the X-axis) transverse to the direction of electron beam propagation (the Y-axis), the beam dump 136 is profiled either electrically or structurally, as will be described below.

A negative terminal of a plasma D.C. discharge voltage supply 140 is coupled to the conductive enclosure 124, and a positive terminal of the voltage supply 140 is coupled to the extraction grid 126. In turn, a negative terminal of an electron beam acceleration voltage supply 142 is connected to the extraction grid 126, and a positive terminal of the voltage supply 142 is connected to the grounded sidewall 102 of the process chamber 100. A coil current supply 146 is coupled to the electromagnets 134-1 and 134-2. Plasma is generated within the chamber 122 of the electron beam source 120 by a D.C. gas discharge produced by power from the voltage supply 140, to produce a plasma throughout the chamber 122. This D.C. gas discharge is the main plasma source of the electron beam source 120. Electrons are extracted from the plasma in the chamber 122 through the extraction grid 126 and the acceleration grid 128 to produce an electron beam that flows into the processing chamber 100. Electrons are accelerated to energies equal to the voltage provided by the acceleration voltage supply 142.

The distribution of electron density across the width of the beam (along the X-axis of FIG. 1C) is liable to exhibit non-uniformities. Such non-uniformities may arise within the electron beam source chamber 122, for example. These non-uniformities affect plasma ion density distribution in the process region 118 and can lead to non-uniform processing of a workpiece in the processing chamber 100. In order to counteract such non-uniformities, the beam dump 136 is profiled along a direction parallel the X-axis, to produce a density distribution of fast electrons—including electrons reflected from the beam dump 136—having a desired profile along the X-axis. This produces a desired X-axis distribution of plasma ion density in the process region 118. In a first embodiment illustrated in FIG. 2A, the profiling of the beam dump 136 is achieved by applying a profiled set of voltages to individual conductive elements of the beam dump 136. The resulting energetic (fast) electron density distribution in the process region 118 is profiled along the X-axis in accordance with the distribution of the set of voltages applied to the individual conductive elements of the beam dump 136, as will be explained below in detail.

Referring to FIG. 2A, the beam dump 136 has a major surface facing the processing region 113 and lying in the path of the electron beam. The beam dump 136 has a width W extending along a direction parallel to the X-axis (i.e., transverse to the electron beam propagation direction or Y-axis). The beam dump 136 consists of an array of individual insulated metal collectors 160 co-planar with the major face of the beam dump 136 and distributed along the width W of the beam dump 136. Insulating spacers 162, which are formed of dielectric materials, are disposed between adjacent ones of the metal collectors 160. Each metal collector 160 has a voltage terminal 164, so that different negative voltages may be applied to different ones of the metal collectors 160 simultaneously. A beam dump voltage supply 166 provides individually selected voltages $V_1, V_2, V_3, \ldots V_n$ to the terminals 164, where n is an integer and is the number of metal collectors 160 in the beam dump 136. A controller 168 controls the individual voltages $V_1, V_2, V_3, \ldots V_n$ furnished by the beam dump voltage supply 166.

The voltages $V_1, V_2, V_3, \ldots V_n$ of the array of metal collectors 160 may be non-uniformly distributed along the X-axis, or "profiled", so as to affect the density distribution of energetic or "fast" electrons (including electrons reflected from the beam dump 136) across the width of the beam dump 136 (along the X-axis). The profile or distribution of the voltages $V_1, V_2, V_3, \ldots V_n$ is selected to counteract a non-uniformity of this density distribution along the X-axis. Such non-uniformity may be determined from conventional measurements of workplaces or wafers previously processed in the chamber 100. Such measurements may be those of etch depth distribution across the workpiece surface in one embodiment. For example, if the energetic electron distribution along the X-axis is center-dense (i.e., center-high and edge low), then the individual voltages simultaneously applied to the metal collectors 160 may be profiled to best counteract this non-uniformity. In one embodiment, for example, the voltages on the metal collectors 160 are profiled so as to be maximum (by magnitude) at the right and left edge metal collectors 160R and 160L and minimum (up to zero) at the center metal collectors 160C, an edge-high profile. In an opposite example, the electron beam may foe known to have an edge-high and center-low distribution of electron density. In this latter example, the non-uniformity is compensated by selecting a center-nigh profile of the voltages simultaneously applied to the metal collectors 160.

FIG. 2B depicts electrical profiling of the voltages on the individual metal collectors 160 using individually controlled variable resistors 170 connected between the respective terminals 164 and a common voltage potential, such as ground for example. The resistances of the different variable resistors 170 are individually controlled by respective outputs $R_1, R_2, R_3, \ldots R_n$ of a variable resistance controller 167 governed by the controller 168. By profiling the distribution of the variable resistances along the X-axis, a desired profile of the voltages on the individual metal collectors 160 of the beam, dump 136 is obtained to adjust the X-axis distribution of the fast electron density, in a manner similar to that of the embodiment of FIG. 2A, Profiling of the beam dump 136 in the embodiments of FIGS. 2A and 2B is dynamically adjustable by adjusting the individual voltages $V_1, V_2, V_3, \ldots V_n$. In the embodiment of FIG. 2A or by adjusting the individual resistances $R_1, R_2, R_3, \ldots R_n$ in the embodiment of FIG. 2B. Such an adjustment changes the profile along the X-axis of the voltages presented by the beam dump 136. Other embodiments do not necessarily involve dynamic adjustment. Specifically, the beam damp 136 may be structurally profiled in accordance with a fixed or permanent structure. For example, the beam dump 136 may be profiled by providing metal collectors 160 in an array of different sizes (areas), and distributing the metal collectors 160 along the X-axis in accordance with size (area). Alternatively (or in addition) the beam dump 136 may be profiled by providing insulating spacers 162 in an array of different sizes (areas), and distributing the insulating spacers 162 along the X-axis in accordance with size (area). This may be referred to as a profiling of the area distribution along the transverse axis of either the metal, collectors 160 or the insulating spacers 162.

In FIG. 2C, the metal collectors 160 are distributed so that the collectors 160 of the largest areas are closest to the center, while the collectors 160 of smallest areas are at the edge, the largest collector 160C being at the center and the smallest collectors 160R and 160L being at the right and left edges, respectively. In the illustrated embodiment, ail of the metal collectors 160 are connected to the same voltage, such as ground.

FIG. 2D depicts a modification of the structurally profiled beam dump of FIG. 2C, in which the distribution of the differently sized metal collectors 160 is opposite from that of FIG. 2C, so that the collectors 160 of largest areas are closest to the right and left ends of the beam dump 136 while the collectors 160 of smallest areas are closest to the center of the beam dump 136.

In the structurally profiled beam dumps of FIGS. 2C and 2D, the metal collectors 160 are depicted as being of different sizes, with the collector size distribution along the X-axis being in accordance with the desired profiling, as described above. In other embodiments, the metal collectors 160 may be of the same size, and the desired profiling is obtained by varying the sizes of the insulating spacers 162, For example, in FIG. 2E a structurally profiled beam dump 136 has uniformly sized metal collectors 160 separated, by dielectric spacers 162 of varying sizes, in which the spacer size (along the X-axis) increases from center to edge. In a similar manner, in FIG. 2F a structurally profiled beam dump 136 has uniformly sized metal collectors 160 separated by dielectric spacers 162 of varying sizes, in which the spacer size (along the X-axis) decreases from center to edge.

In further embodiments, the sizes of both the metal collectors 160 and of the spacers 162 between them may be varied to achieve the desired profile. For example, in the structurally profiled beam dump 136 of FIG. 2G, the sizes of the metal collectors 160 decrease from, center to edge while the sizes of the dielectric spacers 162 increase from center to edge. In the structurally profiled beam dump 136 of FIG. 2H, the sizes of the metal collectors 160 increase from center to edge while the sizes of the dielectric spacers 162 decrease from center to edge.

Figure 3A:
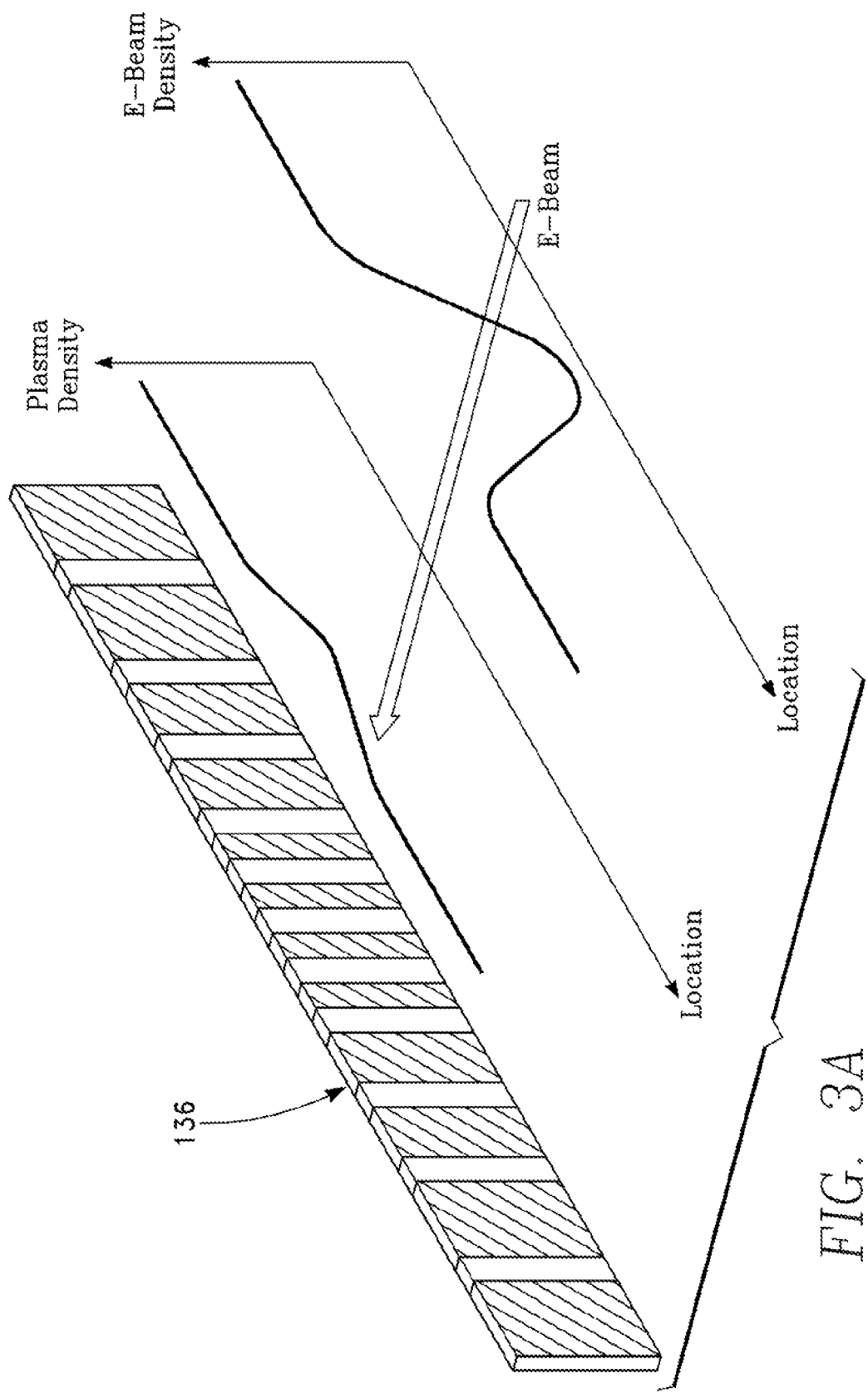
FIGS. 3A, 3B and 3C are graphs characterizing an interaction of a center-dense profiled beam dump with an edge-dense electron beam.
Figure 3B:
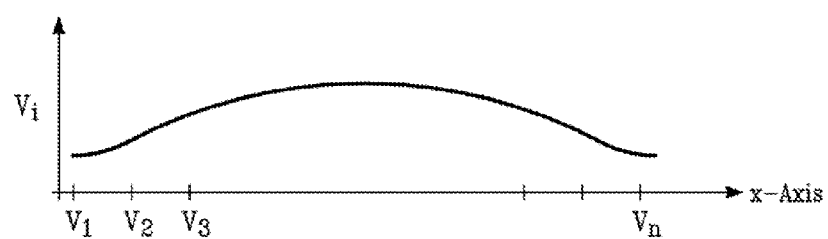
Figure 3C:
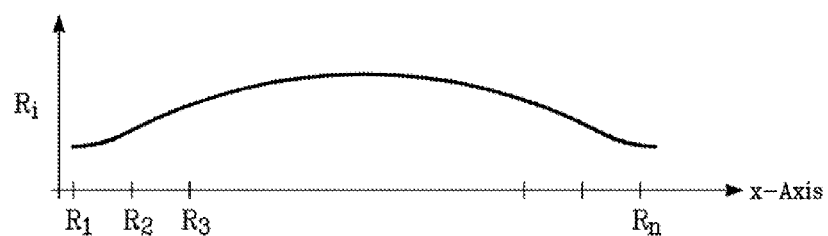

FIG. 3A graphically depicts the effect of a beam dump 136 having a center-dense profile of the insulating spacers 162 or an edge-dense profile of the metal collectors 160. In the example of FIG. 3A, the electron beam source 120 provides an edge-dense electron beam, and the net effect is a plasma density distribution in the process region 118 that is more uniform. FIG. 3B is a graph depicting one example of a desired profiling along the X-axis of the set of voltages $V_1, V_2, V_3, \ldots V_n$ applied to the set of collectors 160 of the electrically profiled beam dump 136 of FIG. 2A. The graph of FIG. 3B depicts the profile of the magnitudes of the voltages, but it is understood that these voltages are negative. FIG. 3C is a graph depicting one example of a desired profiling along the X-axis of the set of variable resistances $R_1, R_2, R_3, \ldots R_n$ connected to the set of collectors 160 of the electrically profiled beam dump 136 of FIG. 2B.

Figure 4A:
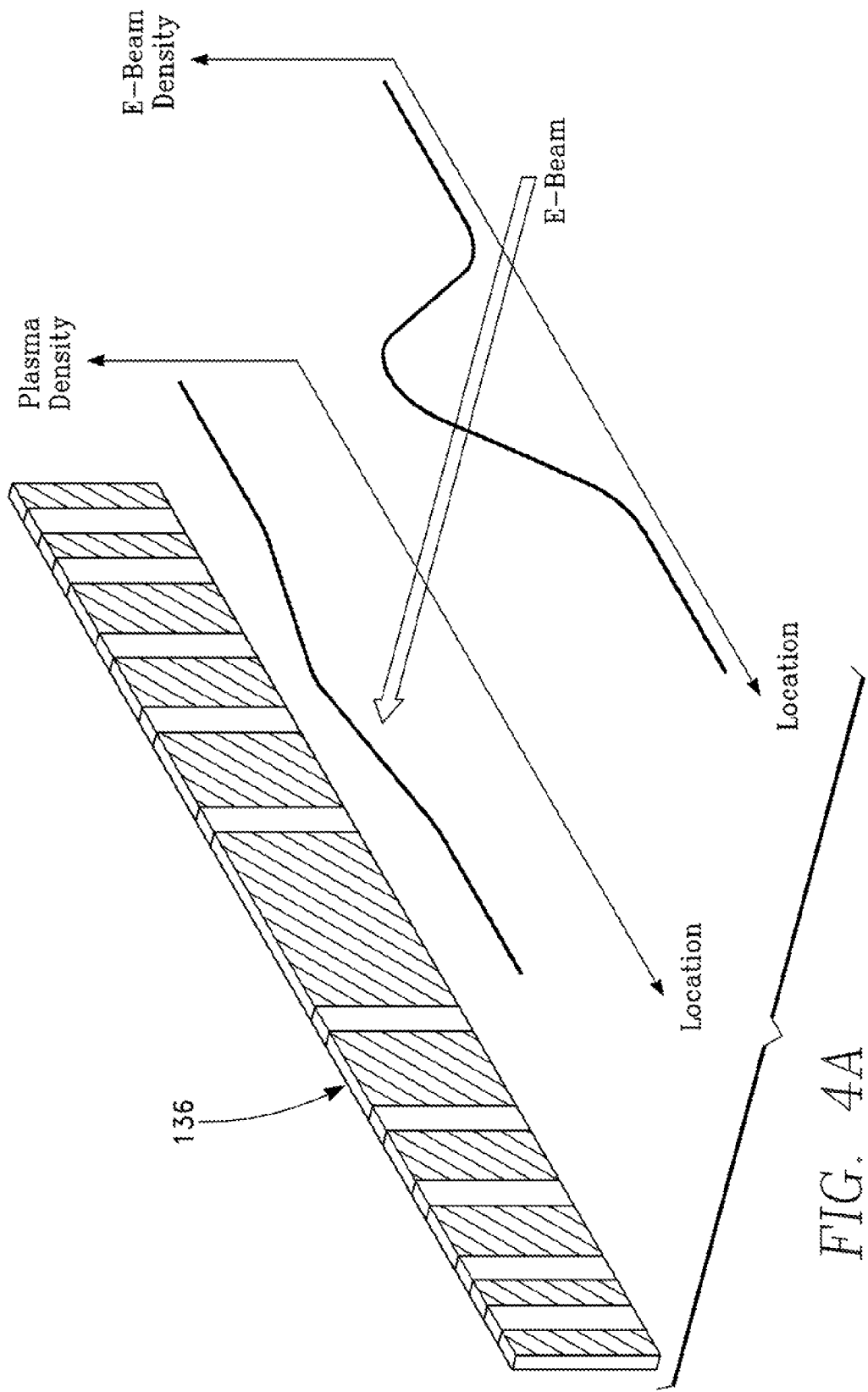
FIGS. 4A, 4B and 4C are graphs characterizing an interaction of an edge-dense profiled beam dump with a center-dense electron beam.
Figure 4B:
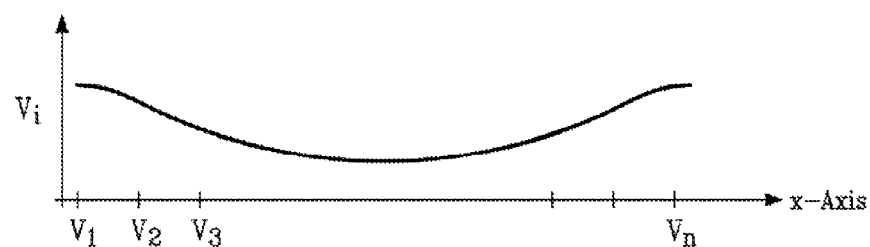
Figure 4C:
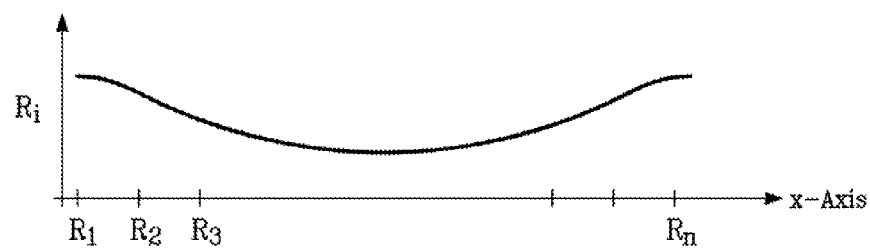

FIG. 4A graphically depicts the effect of a beam, dump 136 having an edge-dense distribution of the insulating spacers 162 or a center-dense distribution of the metal collectors 160. In the example of FIG. 4A, the electron beam source 120 provides a center-dense electron beam, and the net effect is a plasma density distribution in the process region 118 that is more uniform, FIG. 4B is a graph depicting one example of a desired profiling along the X-axis of the set of voltages $V_1$, $V_2$, $V_3$, ... $V_n$ applied to the set of collectors 160 of the electrically profiled beam dump 136 of FIG. 2A. The graph of FIG. 4B depicts the profile of the magnitudes of the voltages, but it is understood that these voltages are negative. FIG. 4C is a graph depicting one example of a desired profiling along the X-axis of the set of variable resistances $R_1$, $R_2$, $R_3$, ... $R_n$ connected to the set of collectors 160 of the electrically profiled beam dump 136 of FIG. 2B.

In the embodiments of FIGS. 2C and 2D, the distribution of the differently sized metal collectors along the X-axis creates a corresponding distribution of the density of the insulating spacers 162 (and an opposite distribution of the metal collectors 160) along the X-axis. This density may be quantified as the average area of the insulating spacers 162 (or the metal collectors 160) present at each location along the X-axis. For example, the center-dense distribution of the differently sized metal collectors 160 in the embodiment of FIG 2C has a higher average area of insulating spacer 162 near its edges (or, equivalently, of metal collectors 160 near its center). This is because the largest area metal collectors 160 are located nearest the center (e.g., the center metal collector 160 having the largest area). In a different example, the edge-dense distribution of the differently sized metal collectors 160 in the embodiment of FIG 2D has a higher average area of metal collectors 160 near its edges and lowest at its center, or a higher average area of insulating spacers 162 near its center. In this case, it may be said that the metal collectors 160 of FIG. 2D have a distribution of density corresponding to an edge-dense profile, while the insulating spacers 162 have a center-dense distribution.

In similar manner, in the embodiments of FIGS. 2E and 2F having differently sized dielectric spacers 162, the spacing of the dielectric spacers 162 at different locations along the X-axis is distributed in accordance with a desired profile. For example, in FIG. 2E, the distribution of the uniformly sized metal collectors 160 is center-dense because the smallest sired spacers 162 are located at the center. Similarly, in FIG. 2F, the distribution of the uniformly sized metal collectors is edge-dense because the smallest sized spacers 162 are located at the edges.

In accordance with a further embodiment, the segmented beam dump 136 may be provided with a desired profile by forming the different segments of the beam dump 136 of different materials with different secondary electron emission coefficients. For example, different ones of the collectors 160 are formed of materials having different secondary electron emission coefficients. In this embodiment, it may not be necessary to insulate the different collectors 160 from one another, so that, in one implementation, the insulating spacers are absent, each collector 160 contacting its neighboring collectors 160. In another implementation, the insulating spacers 162 are present, as depicted in the embodiments discussed above. For example, at least some of the collectors 160 of the embodiments of FIGS. 2A through 2H have different secondary electron emission coefficients. The distribution of the secondary electron emission coefficients of the different collectors 160 along the X-axis may have a particular profile best adapted to counteract a known non-uniformity in the plasma distribution in the chamber 100 (e.g., attributable to a non-uniform electron current distribution or profile produced by the electron beam source 122). For example, the secondary electron emission coefficient distribution may be center-high, to promote plasma density near the center of the X-axis to correct a known center-low plasma distribution non-uniformity. Or, the secondary electron emission coefficient distribution may be edge-high, to promote plasma density near either end of the X-axis to correct a known center-high plasma distribution non-uniformity. Such profiling of the respective secondary electron emission coefficients of the respective collectors 160 may be instead of or in addition to the spatial and/or electrical profiling of the segmented beam dump 136 of the embodiments described above. Examples of different dielectric materials having different secondary electron emission coefficients include: Aluminum (Al), Titanium (Ti), Copper (Cu), iron (Fe), Stainless Steel (SS). Depositing a thin metal or alloy film (such as TiZr, TiZrV, Cu, AgTi) on the surface of another metal, or subjecting a bulk metallic object to a surface treatment (such as thermal baking) also strongly affects the secondary electron emission yield.

While the main plasma source in the electron beam source 120 is a D.C. gas discharge produced by the voltage supply 140, any other suitable plasma source may be employed instead as the main plasma source. For example, the main plasma source of the electron beam source 120 may be a toroidal RF plasma source, a capacitively coupled RF plasma source, or an inductively coupled RF plasma source.

While the foregoing is directed to embodiments of the present invention, other and further embodiments of the invention may be devised without departing from the basic scope thereof, and the scope thereof is determined by the claims that follow.

What is claimed is:

1. A plasma reactor for processing a workplace, comprising:
   a workpiece processing chamber having a processing chamber enclosure comprising a ceiling and a side wall and an electron beam opening in said side wall, a workpiece support pedestal in said processing chamber having a workpiece support surface facing said ceiling and defining a workpiece processing region between said workpiece support surface and said, ceiling, said electron beam, opening facing said workpiece processing region;
   an electron beam source chamber comprising an electron beam source chamber enclosure that is open to said electron beam opening of said workpiece processing chamber; and
   a beam dump in said chamber on a side of said chamber opposite said electron beam opening, said electron beam opening and said beam dump defining an electron beam path therebetween along a first axis, said beam dump comprising an array of metal collectors and an array of insulating spacers, said array of metal collectors and said array of insulating spacers being distributed along a second axis transverse to said first axis, said metal collectors being separated from one another by respective ones of said insulating spacers.

2. The plasma reactor of claim 1 further comprising a source of individually controlled voltages connected to individual ones of said array of metal collectors, and a controller for setting said individually controlled voltages.

3. The plasma reactor of claim 1 further comprising a set of individually controlled variable resistors connected between individual ones of said array of metal collectors and a common voltage source, and a controller for setting resistances of said individually controlled variable resistors.

4. The plasma reactor of claim 1 wherein said array of metal collectors has a distribution of area of said metal collectors along said second axis.

5. The plasma reactor of claim 1 wherein said array of insulating spacers has a distribution of area of said metal collectors along said second axis.

6. The plasma reactor of claim 1 wherein respective ones of said metal collectors are of different sites and are positioned relative to said second axis as a function of the size of each respective metal collector.

7. The plasma reactor of claim 1 wherein respective ones of said insulating spacers are of different sizes and are positioned relative to said second axis as a function of the size of each respective insulating spacer.

8. The plasma reactor of claim 6 wherein said array of metal collectors is distributed along said second axis in accordance respective areas of said metal collectors, and said array of insulating spacers is distributed along said second axis in accordance respective areas of said insulating spacers.

9. A plasma reactor for processing a workplace, comprising:
  a workpiece processing chamber having a processing chamber enclosure comprising a ceiling and a side wall and an electron beam opening in said side wall, a workpiece support pedestal in said processing chamber having a workplace support surface facing said ceiling and defining a workplace processing region between said workpiece support surface and said ceiling, said electron beam opening facing said workpiece processing region;
  an electron beam source chamber comprising an electron beam source chamber enclosure that is open to said electron beam opening of said workpiece processing chamber;
  a beam dump in said chamber on a side of said chamber opposite said electron beam opening, said electron beam opening and said beam dump defining an electron beam path therebetween along a first axis, said beam dump comprising an array of metal collectors insulated from one another and distributed along a second axis transverse to said first axis; and
  a source of individually controlled voltages connected to individual ones of said array of metal collectors, and a controller for setting said individually controlled voltages in accordance with said desired profile.

10. The plasma reactor of claim 9 wherein source of individually controlled voltages comprises an array of individually adjustable voltage supplies coupled to said array of metal collectors.

11. The plasma reactor of claim 9 wherein said source of individually controlled voltages comprises an array of individually controlled variable resistors coupled to individual ones of said array of metal collectors.

12. The plasma reactor of claim 11 further comprising a common voltage source coupled, to each of said variable resistors, wherein said controls a resistance of each of said variable resistors.

13. A plasma reactor for processing a workpiece, comprising:
  a workpiece processing chamber having a processing chamber enclosure comprising a ceiling and a side wall and an electron beam opening in said side wall, a workpiece support pedestal in said processing chamber having a workpiece support surface facing said ceiling and defining a workpiece processing region between said workpiece support surface and said ceiling, said electron beam opening facing said workpiece processing region;
  an electron beam source chamber comprising an electron beam source chamber enclosure that is open to said electron beam opening of said workpiece processing chamber; and
  a beam dump in said chamber on a side of said chamber opposite said electron beam opening, said electron beam opening and said beam dump defining an electron beam path therebetween along a first axis, said beam dump comprising an array of metal collectors distributed along a second axis transverse to said first axis, each of said collectors having a respective secondary electron emission coefficient, said array of metal collectors providing a distribution of secondary electron emission coefficients along said second axis.

14. The plasma reactor of claim 13 wherein said array of metal collectors are unseparated from one another.

15. The plasma reactor of claim 13 farther comprising any array of insulating spacers, and wherein said array of metal collectors are separated from one another by respective ones of said insulating spacers.

16. The plasma reactor of claim 13 wherein said beam source chamber provides an electron beam having a non-uniform source profile along said second axis, said distribution of said secondary electron emission coefficients being complementary to said source profile.

* * * * *